(12) United States Patent
Kim

(10) Patent No.: US 10,957,629 B2
(45) Date of Patent: Mar. 23, 2021

(54) SEMICONDUCTOR PACKAGE

(71) Applicant: SAMSUNG ELECTRONICS CO., LTD., Suwon-si (KR)

(72) Inventor: Young Bae Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 5 days.

(21) Appl. No.: 16/256,895

(22) Filed: Jan. 24, 2019

(65) Prior Publication Data

US 2020/0020613 A1 Jan. 16, 2020

(30) Foreign Application Priority Data

Jul. 10, 2018 (KR) .................. 10-2018-0079925

(51) Int. Cl.
| | |
|---|---|
| *H01L 23/64* | (2006.01) |
| *H01L 23/49* | (2006.01) |
| *H01L 23/00* | (2006.01) |
| *H01L 23/31* | (2006.01) |

(52) U.S. Cl.
CPC .......... *H01L 23/49* (2013.01); *H01L 23/3114* (2013.01); *H01L 24/08* (2013.01)

(58) Field of Classification Search
None
See application file for complete search history.

(56) References Cited

U.S. PATENT DOCUMENTS

| | | | |
|---|---|---|---|
| 6,175,158 B1 | 1/2001 | Degani et al. | |
| 8,378,476 B2 | 2/2013 | Lee et al. | |
| 8,399,992 B2 | 3/2013 | Park et al. | |
| 2007/0216005 A1* | 9/2007 | Yim | ...................... H01L 25/105 257/686 |
| 2010/0301469 A1* | 12/2010 | Choi | ..................... H01L 25/105 257/693 |
| 2011/0068481 A1* | 3/2011 | Park | .................... H01L 23/3128 257/777 |
| 2014/0266281 A1 | 9/2014 | Wang et al. | |
| 2015/0070865 A1* | 3/2015 | Yew | ...................... H01L 21/486 361/783 |

(Continued)

FOREIGN PATENT DOCUMENTS

| | | |
|---|---|---|
| CN | 108257882 A | 7/2018 |
| JP | 2008124176 A | 5/2008 |
| JP | 2008162016 A | 7/2008 |

OTHER PUBLICATIONS

Kim J. et al., Warpage issues and assembly challenges using coreless package substrate. InIPC APEX EXPO Proceedings, Feb. 28, 2012, pp. 1-13.

*Primary Examiner* — Joseph C. Nicely
*Assistant Examiner* — Lamont B Koo
(74) *Attorney, Agent, or Firm* — Volentine, Whitt & Francos, PLLC

(57) ABSTRACT

A semiconductor package includes a package substrate, a flip chip coupled to the package substrate, an interposer stacked on the flip chip and including a first terminal and a second terminal at an upper surface thereof, a bonding wire which connects the first terminal and the package substrate and a mold layer which covers the interposer, the flip chip and the bonding wire. The mold layer has a signal hole which exposes the second terminal, and at least one dummy hole spaced apart from the signal hole on an upper surface of the interposer.

20 Claims, 15 Drawing Sheets

(56) References Cited

U.S. PATENT DOCUMENTS

| | | |
|---|---|---|
| 2015/0171028 A1 | 6/2015 | Jo et al. |
| 2016/0336296 A1 | 11/2016 | Jeong et al. |
| 2016/0381800 A1 | 12/2016 | Yagnamurthy et al. |
| 2017/0033084 A1* | 2/2017 | Chang ................ H01L 25/0657 |

* cited by examiner

SEMICONDUCTOR PACKAGE

PRIORITY STATEMENT

This application claims priority from Korean Patent Application No. 10-2018-0079925 filed on Jul. 10, 2018 in the Korean Intellectual Property Office, and all the benefits accruing therefrom under 35 U.S.C. 119, the contents of which in its entirety are herein incorporated by reference.

BACKGROUND

1. Field

The inventive concept relates to a semiconductor package.

2. Description of the Related Art

The semiconductor industry is continuously attempting to miniaturize and reduce the thickness and weight of semiconductor products while maintaining a high degree of integration of the products. To these ends, various types of packages having a stack of components mounted on a substrate have been developed and their applications and use are gradually increasing.

However, the stacked components of the package include various materials having different coefficient of thermal expansions. Therefore, warpage in which the package is twisted in a specific direction may occur during the manufacturing process such as when a mold layer that encapsulates the components on the substrate is formed. Such a warpage may significantly lower the reliability of the packages. Therefore, there is a need for a countermeasure to prevent the warpage.

SUMMARY

According to an aspect of the present inventive concept, there is provided a semiconductor package comprising a package substrate, a flip chip coupled onto the package substrate, an interposer stacked on the flip chip and including a substrate and a first terminal and a second terminal on an upper surface of the substrate of the interposer, a bonding wire which connects the first terminal and the package substrate, and a mold layer which covers the interposer, the flip chip and the bonding wire. The mold layer has a signal hole therein which opens to the second terminal, and at least one dummy hole therein spaced apart from the signal hole and situated over the upper surface of the interposer.

According to another aspect of the present inventive concept, there is provided a semiconductor package comprising a lower package and an upper package stacked on the lower package, and in which the lower package includes a package substrate, a flip chip coupled to the package substrate, an interposer stacked on the flip chip and including a substrate and a first terminal and a second terminal on an upper surface of the substrate of the interposer, and a mold layer which covers the interposer and the flip chip. The mold layer has a signal hole therein open at the second terminal, and at least one dummy hole therein spaced apart from the signal hole and situated over the upper surface of the interposer.

According to still another aspect of the present inventive concept, there is provided a semiconductor package comprising a package substrate, a plurality of micro bumps disposed on the package substrate, a flip chip stacked on the plurality of micro bumps and electrically connected to the package substrate via the plurality of micro bumps, an underfill film which surrounds the plurality of micro bumps between the flip chip and the package substrate, an adhesive film on the flip chip, an interposer which is stacked on the adhesive film and includes a substrate and a first terminal and a second terminal at an upper surface of the substrate of the interposer, a bonding wire which electrically connects the first terminal and the package substrate, and a mold layer which covers the interposer, the flip chip and the bonding wire. The mold layer has a signal hole therein open at the second terminal, and at least one dummy hole therein spaced apart from the signal hole and situated over the upper surface of the interposer.

BRIEF DESCRIPTION OF THE DRAWINGS

The above and other aspects and features of the present inventive concept will become more apparent by describing in detail various examples thereof with reference to the attached drawings, in which.

DETAILED DESCRIPTION

Figure 1:
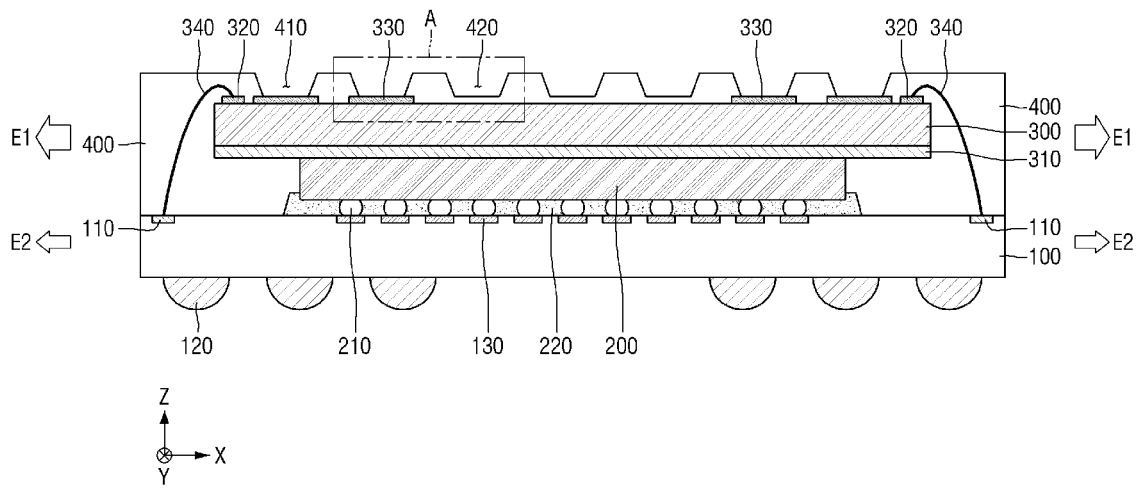
FIG. 1 is a cross-sectional view of an example of a semiconductor package according to the inventive concept.

One example of a semiconductor package according to the inventive concept will now be described with reference to FIGS. 1 to 4.

In the figures, direction X is a first horizontal direction, and direction Y is a second horizontal direction intersecting the first direction X. The first direction X and the second direction Y may be perpendicular to each other. A third direction Z has a vertical component and intersects both the first direction X and the second direction Y. For example, the third direction Z may be a vertical direction, i.e., may be perpendicular to the first direction X and the second direction Y. In this case, the first direction X, the second direction Y, and the third direction Z may all orthogonal to each other.

Furthermore, in the description that follows, although the drawings show plural ones of like elements, the elements may be referred individually at times for ease of description. It will be understood that each description of a feature or aspect of an individual element generally applies to each of the other like elements. Also, like elements are designated by like reference numerals throughout the drawings. Therefore, descriptions of elements already described in one example may be omitted in subsequently described examples for the sake of brevity.

Referring to FIG. 1, the semiconductor package includes a package substrate 100, a flip chip 200, a micro bump 210, a first underfill film 220, an interposer 300, an adhesive film 310, a bonding wire 340 and a mold layer 400.

The package substrate 100 may receive the flip chip 200 and the interposer 300 on an upper surface thereof. In particular, the flip chip 200 and the interposer 300 may be sequentially stacked on the upper surface of the package substrate 100. The package substrate 100 may be, for example, a printed circuit board (PCB) or may comprise a ceramic substrate having conductive elements integrated therewith. However, the inventive concept is not limited thereto. In any case, the term "package substrate" as will be generally understood by persons of ordinary skill in the art will refer to a substrate (non-conducting plate-shaped body) having conductive elements integrated therewith, e.g., terminals at the top and/or bottom surface of the substrate and internal wiring (vias, internal redistribution wiring layer(s)) that extend through/within the substrate to provide electrical paths from the upper surface to the bottom surface of the substrate.

In an example in which the package substrate 100 is a PCB, the substrate may be made of at least one layer of material selected from phenol resin, epoxy resin, and polyimide. The substrate may include, for example, at least one layer of material selected from FR4, tetrafunctional epoxy, polyphenylene ether, epoxy/polyphenylene oxide, BT (bismaleimide triazine), thermount, cyanate ester, polyimide, and liquid crystal polymer. The upper surface of the substrate may be covered with a solder resist.

For conductive elements the package substrate 100 may include a wire bonding terminal 110 and a micro bump terminal 130. The wire bonding terminal 110 and the micro bump terminal 130 may be arranged at an upper surface of the package substrate 100. The wire bonding terminal 110 and the micro bump terminal 130 may be exposed without being covered with the solder resist.

Furthermore, although not illustrated, the package substrate 100 may include a lower terminal on the lower surface of its substrate. The lower terminal may be a portion on which the first solder ball 120 abuts.

The lower terminal, the wire bonding terminal 110 and the micro bump terminal 130 may be formed of at least one material selected from the group consisting of copper, nickel, stainless steel and beryllium copper. The lower terminal, the wire bonding terminal 110 and the micro bump terminal 130 may be exposed by solder resist of the circuit wiring patterned after a Cu foil is applied to the upper surface and the lower surface of the body of the substrate of the package substrate 100.

For conductive elements the package substrate 100 may also include internal wiring (i.e., conductive elements extending within the body the package substrate 100) electrically connected to the wire bonding terminal 110, the micro bump terminal 130 and the lower terminal. The internal wiring may individually and electrically connect respective ones of the wire bonding terminal 110, the micro bump terminal 130, and the lower terminal along separate paths.

The wire bonding terminal 110 may be electrically connected to the interposer 300 by the bonding wire 340. The wire bonding terminal 110 may be arranged on the outer side of the upper surface of the package substrate 100 as compared with the micro bump terminal 130. This is because the micro bump terminal 130 is connected to the flip chip 200 and the wire bonding terminal 110 is connected to the interposer 300 via the bonding wire 340.

A first solder ball 120 may be disposed on the lower surface of the package substrate 100. The first solder ball 120 may be in contact with the lower terminal. The first solder ball 120 may be convex in a downward direction, that is, in the third direction Z. The first solder ball 120 may be a used for electrically connecting the package 100 to an external electronic component/device.

The micro bump terminal 130 may be located on the inner side of the package substrate 100 as compared with the wire bonding terminal 110. A plurality of micro bump terminals 130 may be provided, and the plurality of micro bump terminals 130 may be arranged at regular intervals although the inventive concept is not limited thereto.

The upper surface of the micro bump terminal 130 may be in contact with the micro bump 210. The micro bump terminal 130 may be a portion at which the package substrate 100 and the flip chip 200 are electrically connected to each other. The micro bump terminals 130 are arranged adjacent to each other and may be arranged relatively far from the wire bonding terminal 110.

The flip chip 200 may be a logic semiconductor chip which is a micro-processor. For example, the flip chip 200 may be a central processing unit (CPU), a controller, an application specific integrated circuit (ASIC), or the like.

The micro bumps 210 may be arranged under the flip chip 200. The micro bumps 210 may electrically and physically connect the flip chip 200 and the package substrate 100, and may fix the flip chip 200 to the upper surface of the package substrate 100. Each micro bump 210 may be coupled with a micro bump terminal 130.

The micro bump 210 may be, for example, a micro solder ball or a solder paste. The micro bump 210 may be electrically connected to a circuit of the flip chip 200, i.e., to an integrated circuit (IC) inside a body of the flip chip 200.

The first underfill film 220 may surround the side surface of the micro bump 210. The first underfill film 220 may fill a space between the flip chip 200 and the package substrate 100. The bonding strength between the flip chip 200 and the package substrate 100 may be increased by the first underfill film 220. Also, the first underfill film 220 may counteract the tendency of other constituent elements such as the flip chip 200, the package substrate 100 and the micro bump 210 to be deformed by external environmental conditions such that the package retains excellent physical strength. For example, the first underfill film 220 may occupy a space into which foreign matter and moisture would otherwise penetrate and may prevent an electrical migration between vertically adjacent metal layers.

The first underfill film 220 may include an underfill resin such as epoxy resin, silica filler or flux.

Although not illustrated, the first underfill film 220 may have an air gap therein. The air gap may be a void that forms when the first underfill film 220 is formed.

The interposer 300 may be stacked on the flip chip 200. The interposer 300 may be longer in the first direction X than the flip chip 200. The interposer 300 may be centered on the flip chip 200. As a result, the lower surface of the outer periphery of the interposer 300 may extend laterally (horizontally outward) of the flip chip 200 and be spaced uniformly from the package substrate 100.

The interposer 300 may include at least one of a silicon, glass, ceramic, or plastic substrate. However, the inventive concept is not limited thereto. For convenience, the interposer 300 will be described below as having a silicon substrate.

The interposer 300 may include a first terminal 320 and a second terminal 330 on the upper surface of its substrate. The first terminal 320 and the second terminal 330 may be connected to internal wiring of the interposer 300 (wiring inside and forming conductive paths through the substrate of the interposer 300).

The first terminal 320 may be electrically connected to the wire bonding terminal 110 of the package substrate 100 by the bonding wire 340. The first terminal 320 may be electrically connected the package substrate 100 and the interposer 300.

The second terminal 330 may be a portion at which another package stacked on the interposer 300 is electrically connected to the package of the inventive concept. The second terminal 330 may be a conductive pad on which a solder ball is arranged and electrically connected to another package.

The adhesive film 310 may be disposed on the lower surface of the interposer 300. Specifically, the adhesive film 310 may be disposed between the lower surface of the interposer 300 and the upper surface of the flip chip 200. The adhesive film 310 may fix the interposer 300 and the flip chip 200 to each other. With the adhesive film 310, the interposer 300 may be fixed to the upper part of the flip chip 200.

The dimensions of the interposer 300 in the first direction X and the second direction Y may be greater than those of the flip chip 200. That is, a surface area or footprint of the interposer 300 may be greater than that of the flip chip 200. As a result, a part of the lower surface of the interposer 300 does not overlie the upper surface of the flip chip 200. Likewise, because the adhesive film 310 is formed along the lower surface of the interposer 300, one part of the adhesive film 310 is in contact with the upper surface of the flip chip 200 whereas another part of the adhesive film 310 is not in contact with the upper surface of the flip chip 200.

The bonding wire 340 may connect the wire bonding terminal 110 of the package substrate 100 with the first terminal 320 of the interposer 300. The bonding wire 340 is conductive. The bonding wire 340 may be formed of at least one material selected from the group consisting of gold (Au), silver (Ag), platinum (Pt), aluminum (Al), copper (Cu), palladium (Pd), nickel (Ni), cobalt (Co), chromium (Cr) and titanium (Ti), and may be provided in the package by a wire bonding apparatus. Thus, the bonding wire 340 is a signal transmission medium that electrically connects the wire bonding terminal 110 and the first terminal 320.

The mold layer 400 may cover the upper surface of the package substrate 100, the side surfaces of the first underfill film 220, the side surfaces of the flip chip 200, the upper surface and the side surfaces of the interposer 300, the lower surface and the side surfaces of the adhesive film 310, and the bonding wire 340.

The mold layer 400 may be formed of, for example, a silicon-based material, a thermosetting material, a thermoplastic material, a UV treatment material, or the like. In addition, the mold layer 400 may be formed of a polymer such as a resin, and may be formed of, for example, EMC (Epoxy Molding Compound).

The mold layer 400 includes a signal hole 410 and a dummy hole 420 in its upper surface. For purposes of this description only, i.e., in consideration of an order in which various examples of semiconductor packages according to the inventive concept are described herein, the dummy hole 420 will be referred to as a first dummy hole 420. The signal hole 410 is formed in part of the mold layer 400 located over the upper surface of the interposer 300. The signal hole 410 leads from the upper surface of the mold layer 400 to and is open at a second terminal 330 located on the upper surface of the interposer 300. Hence, the signal hole 410 may expose the second terminal 330 to the outside. A plurality of signal holes 410 may be provided, and each of the plurality of signal holes 410 may have the same size and shape and lead to and open at a respective one of the second terminals 330. However, the inventive concept is not limited to signal holes of the same size and shape. The signal hole 410 may receive a solder ball abutting the second terminal 330 as will be described later in connection with another example of the inventive concept.

The first dummy hole 420 may also be formed in a portion of the mold layer 400 located over the upper surface of the interposer 300. Unlike the signal hole 410, the first dummy hole 420 does not expose any terminals. Moreover, the "dummy hole" may be filled or completely occupied by a non-electrically conducting medium and in this respect may be empty or filled with an insulating material. Thus, as the term "dummy" would be understood in this context by those of ordinary skill in the art, the first dummy hole 420 does not delimit any path related to signal transmission, i.e., is not occupied by any conductor that constitutes operative circuitry in the package.

The first dummy hole 420 may be a recess in the upper surface of the mold layer. In this example, the first dummy hole 420 does not extend completely through the portion of the mold layer 400 located over the interposer 300. Therefore, it is possible to prevent the upper surface of the interposer 300 from being damaged. Also, a plurality of first dummy holes 420 may be provided. The plurality of first dummy holes 420 may be surrounded by the signal holes 410.

The first dummy hole 420 can prevent the package from warping or mitigate the warping of the package. A semiconductor package according to examples of the inventive concept will typically include elements of a plurality of materials with different coefficients of thermal expansion (CTE). As a result, the volumes of thermal expansion of each element due to changes in temperature may be different from each other.

For example, the coefficient of thermal expansions of the mold layer 400 and the package substrate 100 may be different from each other, and the volumes of thermal expansion thereof may be different from each other accordingly. For example, considering the first direction X, the mold layer 400 may experience a first thermal expansion E1, and the package substrate 100 may experience a second thermal expansion E2. In this case, the change in dimension of the mold layer 400 in the first direction X as a result of the first thermal expansion E1 may be much greater than the change in dimension of the package substrate 100 in direction X as a result of the second thermal expansion E2. As a result, the semiconductor package could be distorted, which distortion is referred to as warpage.

Figure 2:
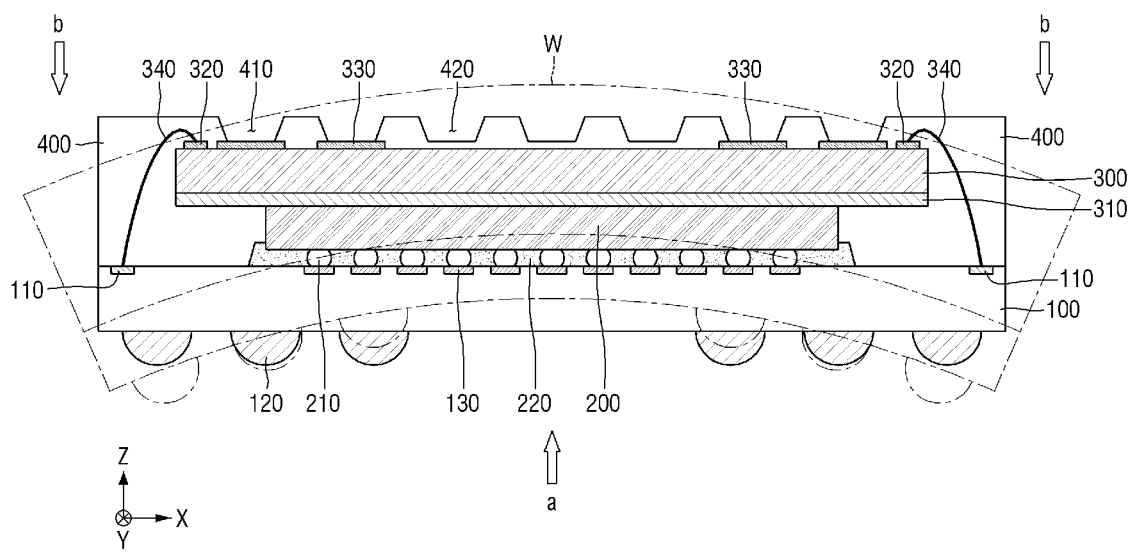
FIG. 2 is a conceptual diagram illustrating the warpage of the semiconductor package of FIG. 1.

FIG. 2 shows an example of the semiconductor package that has a warpage W created due to the difference between the first thermal expansion E1 and the second thermal expansion E2 described above with reference to FIG. 1. In this example, a central portion of the package is bent upwardly in direction (a), and an outer portion bends downwardly in a direction (b). In this example, the semiconductor package exhibits warpage in the shape of an arc. Of course, the warpage W is exemplary considering only the mold layer 400 and the package substrate 100. Because the semiconductor package includes many other materials besides those of the mold layer 400 and substrate of the package, various and very complex forms of warpage may occur.

However, a semiconductor package having the first dummy hole 420 according to the inventive concept may prevent or minimize such warpage from occurring. The first dummy hole 420 as formed in the upper part of the mold layer 400 acts to relax the mold layer 400 in its tendency to undergo thermal expansion. In particular, the mold layer 400 undergoes no thermal expansion in the region of the first dummy hole 420 and thus, the difference in degree of thermal expansion between the mold layer 400 and elements of other materials may be minimized.

As a result, a semiconductor package according to the inventive concept will exhibit relatively low amounts of warpage and corresponding improvements in durability and reliability.

Figure 3:
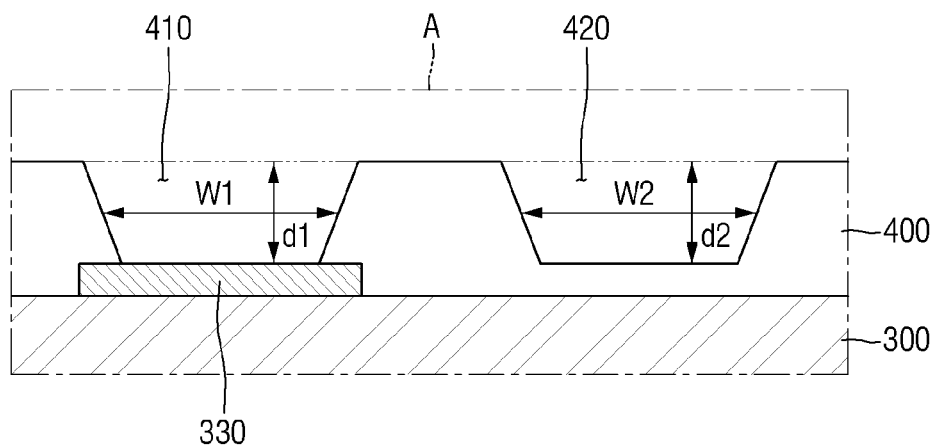
FIG. 3 is an enlarged view of part A of the package of FIG. 1.

Referring to FIG. 3, the signal hole 410 and the first dummy hole 420 may have the substantially the same size. Specifically, the signal hole 410 may have a first width W1 in the first direction X. The first dummy hole 420 may have a second width W2 in the first direction X. The first width W1 may be the same as the second width W2. Here, the term "substantially the same" is used to account for minute differences resulting from inherent characteristics of the precision of the manufacturing process.

Also, the signal hole 410 may have a first depth d1. The first dummy hole 420 may have a second depth d2. The first depth d1 and the second depth d2 may be substantially the same. In other words, the signal hole 410 and the first dummy hole 420 may have substantially the same depth.

Due to the second terminal 330 formed on the upper surface of the interposer 300, the signal hole 410 may penetrate through part of the mold layer 400 to expose the upper surface of the second terminal 330. On the other hand, the first dummy hole 420 having the same depth as the signal hole 410 will not penetrate through the part of the mold layer 400 over the interposer 300 because the first dummy hole 420 and the upper surface of the interposer 300 are spaced apart from each other by the thickness of the second terminal 330. Accordingly, the upper surface of the interposer 300 may not be exposed by the first dummy hole 420.

Figure 4:
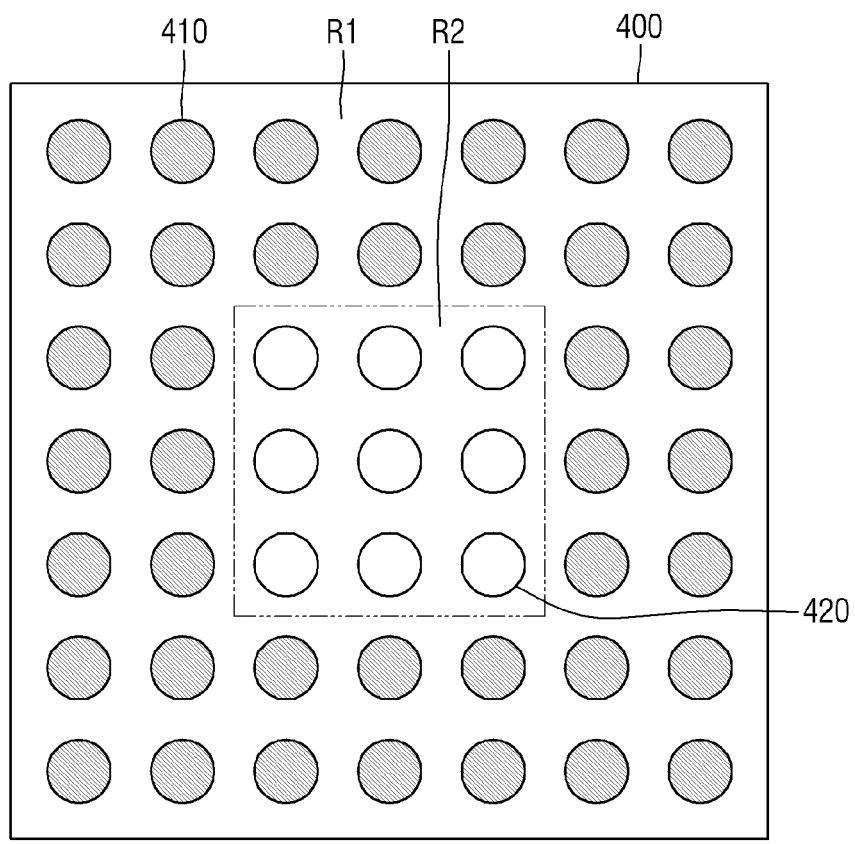
FIG. 4 is a plan view of the semiconductor package of FIG. 1.

Referring to FIG. 4, a horizontal region of the mold layer 400 may include a first region R1 and a second region R2. The first region R1 may be a region which surrounds the second region R2.

Specifically, the first region R1 may be an outer region in which the second terminals 330 of the interposer 300 are disposed, and the second region R2 may be a central region in which no second terminal 330 of the interposer 300 is disposed.

The second terminals 330 may be arranged along the outside of the interposer 300 to stabilize an upper package stacked on the package of the inventive concept. Specifically, when solder balls are formed on the second terminals 330 and an upper package is stacked thereon, the upper package will be supported stably because the solder balls will occupy a wide area corresponding to the large area across which the second terminals 330 are arranged.

The second region R2 may be a region in which the first dummy holes 420 are arranged. Significantly, the first dummy holes 420 may be arranged in the second region R2 because the second region R2 is a region in which no signal hole 410 is provided. Because the first dummy hole 420 is used to minimize or reduce the warpage of the package, the first dummy hole 420 should be formed in such a region that it does not interfere with the function of the other constituent elements, and the second region R2 may be such a region.

In FIG. 4, a plurality of doubly aligned signal holes 410 and an array of nine first dummy holes 420 are illustrated. Also, the first dummy holes 420 may be arranged symmetrically with respect to the geometric center of the upper surface (footprint) of the mold layer 400. However, the inventive concept is not limited to these numbers and arrangement of signal holes 410 and first dummy holes 420.

The shape of the first dummy hole 420 (as viewed in a plan view) may be the same as the shape of the signal hole 410. Also, referring to FIGS. 3 and 4, the first dummy hole 420 and the signal hole 410 may have the same shape, size, and depth. This may be attributed to the fact that the processes of forming the first dummy hole 420 and the signal hole 410 may be the same. Accordingly, the process of manufacturing the semiconductor package according to the inventive concept may be extremely easy and simple. That is, because the first dummy hole 420 can be formed in the same process as the process of forming the signal hole 410, the forming of the first dummy hole 420 does not burden the manufacturing process. Therefore, according to an aspect of the inventive concept, warpage of a semiconductor package may be suppressed without significantly increasing the cost of manufacturing the package.

Referring to FIG. 1 again, the mold layer 400 of the semiconductor package according to this example essentially has a substantial thickness above the level of the upper surface of the interposer 300. This is because a bend in the bonding wire 340 must be provided in the bonding wire above the level of the upper surface of the interposer 300. Therefore, it is not possible for the mold layer 400 to be formed only to the level of, and hence expose, the upper surface of the interposer 300 or to have a very small thickness above the level of the upper surface of the interposer 300.

Thus, using the substantial thickness of the mold layer 400 above the level of the upper surface of the interposer in the manner described above, i.e., by forming a dummy holes therein, is an efficient and effective solution to the problem of package warpage offered by the inventive concept. Furthermore, the effect of the present inventive concept may be enhanced by forming a plurality of first dummy holes 420 because the warpage is related not only to the volume of the mold layer but also to its surface area.

Hereinafter, another example of a semiconductor package according to the inventive concept will be described referring to FIGS. 5 and 6.

Figure 5:
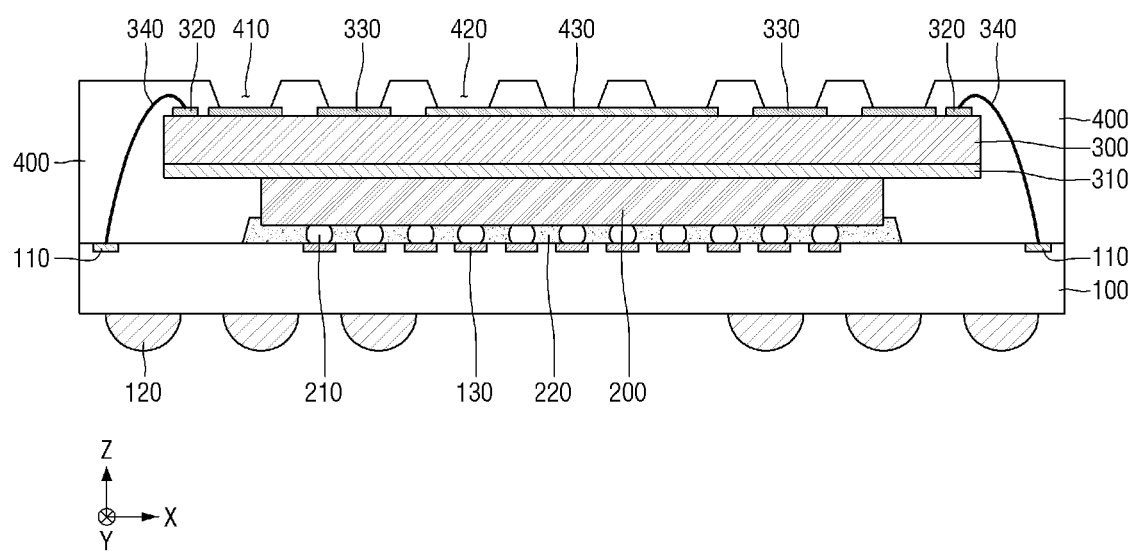
FIG. 5 is a cross-sectional view of another example of a semiconductor package according to the inventive concept.
Figure 6:
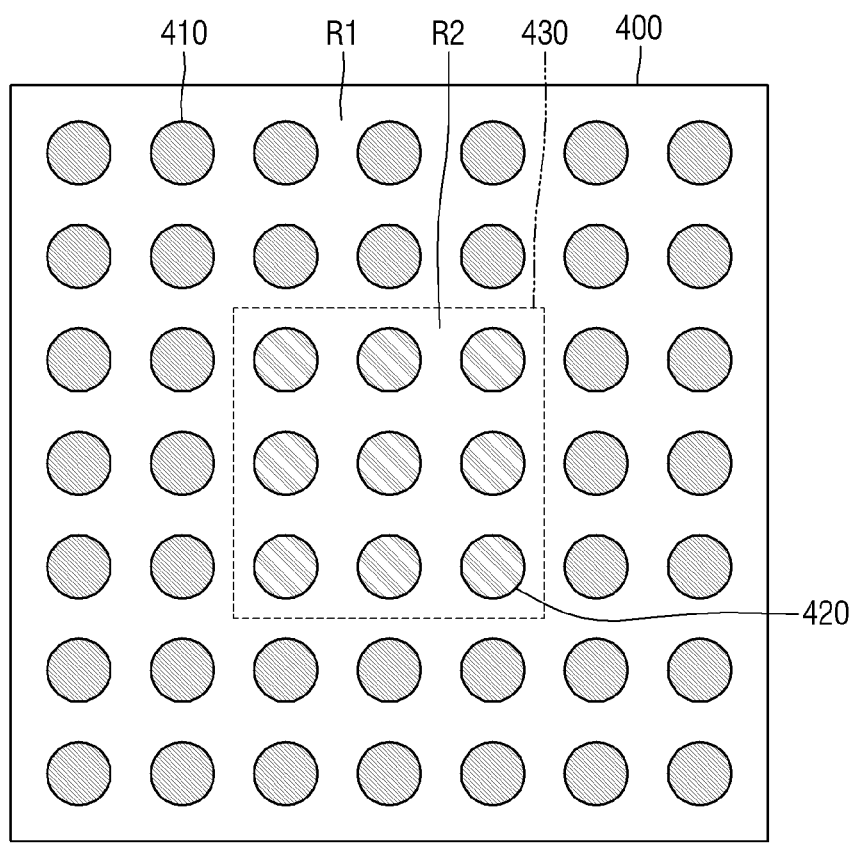
FIG. 6 is a plan view of the semiconductor package of FIG. 5.

The semiconductor package of FIGS. 5 and 6 is similar to that of the package of FIGS. 1, 3 and 4 but further includes a protective film 430.

The protective film 430 may be formed on the upper surface of the interposer 300. The protective film 430 may be formed in the second region R2 of the mold layer 400. The protective film 430 may be exposed to the outside by the first dummy hole 420. The protective film 430 may not occupy any of the first region R1 in which the signal hole 410 is formed.

The protective film 430 may be disposed laterally of the first terminal 320 and the second terminal 330. For example, the first terminal 320 and the second terminal 330 are disposed on the outer periphery of the upper surface of the interposer 300, and the protective film 430 is disposed at the central portion of the upper surface of the interposer 300.

The thickness of the protective film 430 may be the same as the thickness of the second terminal 330. Accordingly, when the first dummy hole 420 also has the same depth as the signal hole 410, the first dummy hole 420 may penetrate the part of the mold layer 400 overlying the protective film 430. The protective film 430 may thus prevent the interposer 300 from being damaged when the first dummy hole 420 is formed. The protective film 430 may be, but is not limited to, an insulating film such as a film of polyimide (PI) or polystyrene.

Hereinafter, another example of a semiconductor package according to the inventive concept will be described referring to FIG. 7.

Figure 7:
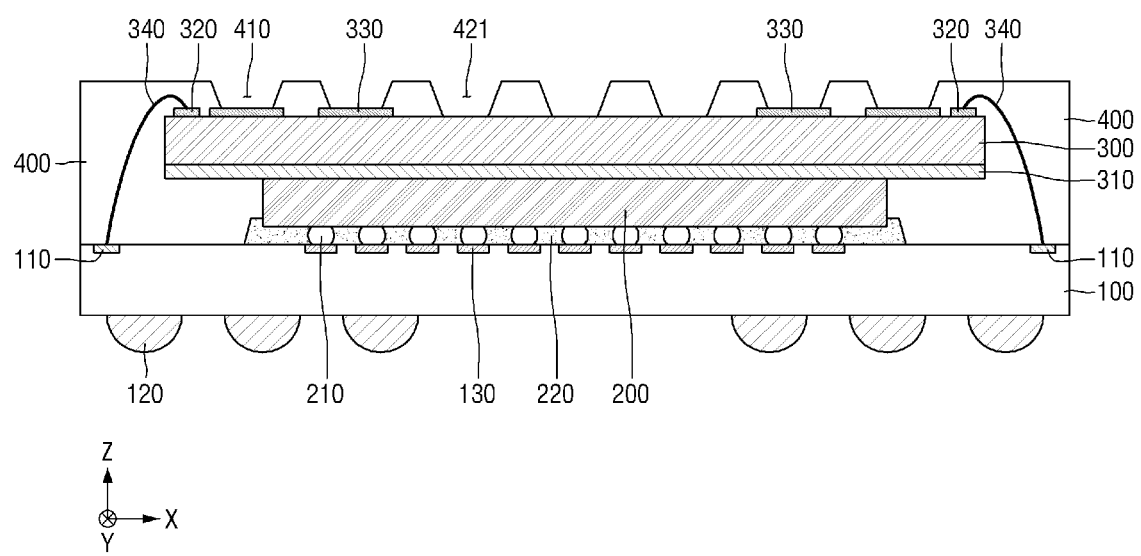
FIG. 7 is a cross-sectional view of another example of a semiconductor package according to the inventive concept.

Referring to FIG. 7, the semiconductor package of this example includes a dummy hole 421 deeper than the signal hole 410. For purposes of this description only, the dummy hole 421 will be referred to as a second dummy hole.

The second dummy hole 421 may completely penetrate the part of the mold layer 400 on the interposer 300. Accordingly, it is possible to precisely and effectively prevent warpage of the semiconductor package.

That is, the second dummy hole 421 effectively removes part of the mold layer 400 on the interposer 300 in the third direction Z, thereby reducing the degree of thermal expansion to a maximum extent. As a result, the warpage of the entire semiconductor package can be efficiently suppressed.

Figure 8:
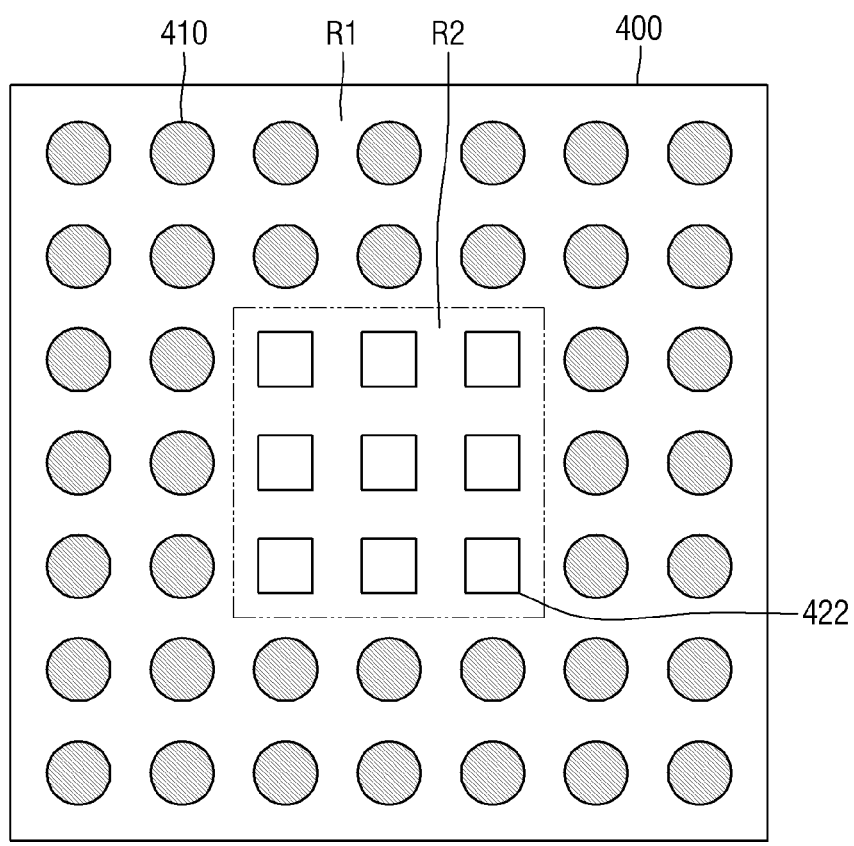
FIG. 8 is a plan view of an example of a semiconductor package according to the inventive concept.

Another version of a layout of signal and dummy holes of a semiconductor package according to the inventive concept is shown in FIG. 8.

Referring to FIG. 8, examples of semiconductor package according to the inventive concept include a dummy hole 422 having a shape different from that of the signal hole 410. For, the dummy hole 422 may have a rectangular horizontal cross section. For purposes of this description only, the dummy hole 422 will be referred to as a third dummy hole.

In a case in which the overall shape of the mold layer 400 is a square, the rectangular third dummy hole 422 may relax the mold layer uniformly in a horizontal plane. Therefore, the warpage can be effectively suppressed by the third dummy hole 422.

Although the shape of the horizontal cross section of the third dummy hole 422 is illustrated as square in FIG. 8, the horizontal cross section of the third dummy hole 422 may have other shapes. For example, the shape of the horizontal cross-section of the third dummy hole 422 may be triangular or elliptical. In other words, the shape of the horizontal cross section of the dummy hole is not be particularly limited as long as it is tailored to the shape of the mold layer to efficiently prevent the warpage.

Figure 9:
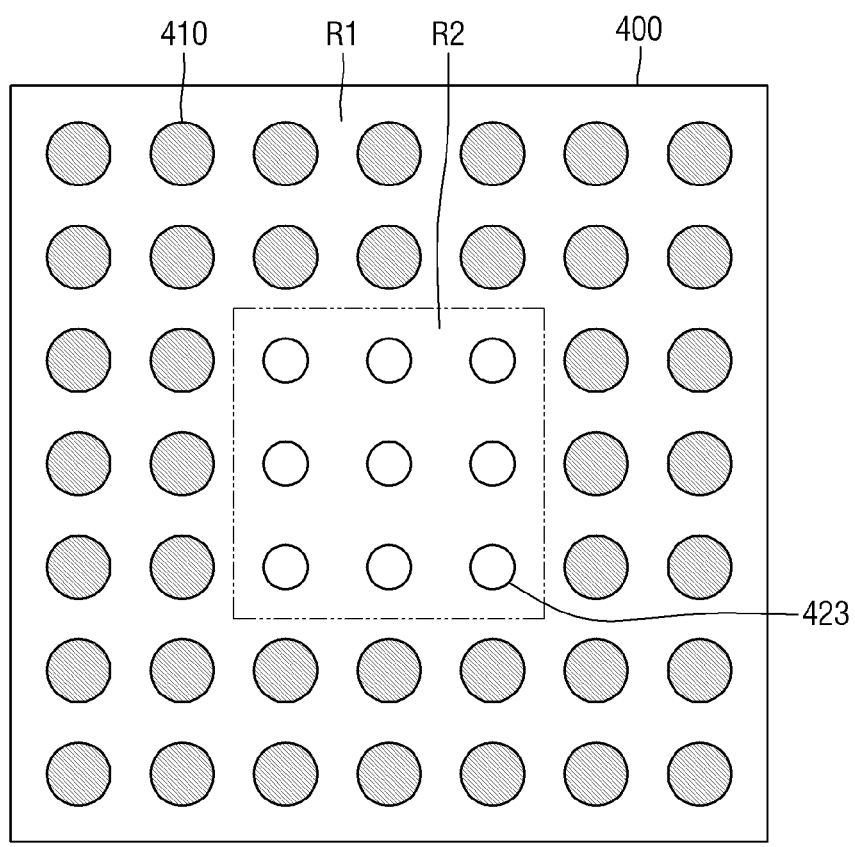
FIG. 9 is a plan view of another example of a semiconductor package according to the inventive concept.

Another version of a layout of dummy and signal holes of semiconductor package according to the inventive concept is shown in FIG. 9.

Referring to FIG. 9, the semiconductor package includes a dummy hole 423 having a size different from that of the signal hole 410. For example, the dummy hole 423 may be smaller than the signal hole 410. For purposes of this description only, the dummy hole 423 will be referred to as a fourth dummy hole.

In this example, an appropriate number of the fourth dummy holes 423 each of a size smaller than that of each signal hole 410 and formed in the second region R2 is especially effective at preventing the warpage.

In the example of FIG. 9, all of the fourth dummy holes 423 are illustrated as being of the same size, but they may have sizes different from each other. In other words, the sizes of the fourth dummy holes 423 are not limited but made different than the size of the signal holes for the purpose of effectively preventing warpage.

Figure 10:
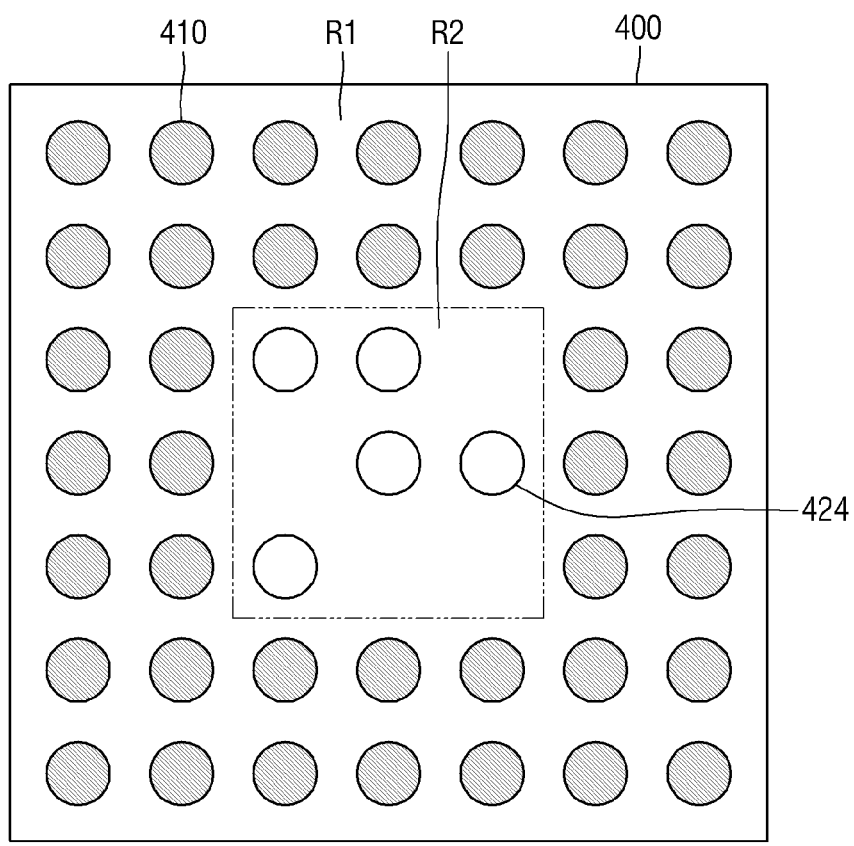
FIG. 10 is a plan view of another example of a semiconductor package according to the inventive concept.

Another version a layout of the signal and dummy holes of a semiconductor package according to the inventive concept is shown in FIG. 10.

Referring to FIG. 10, the semiconductor package includes dummy holes 424 arranged in rows and columns with the signal holes 410 but with different numbers of the dummy holes and/or at different positions from one another amongst the rows and columns. For purposes of this description only, the dummy holes 424 will be referred to as fifth dummy holes.

In some case, a semiconductor package may tend to warp into a shape that is not symmetrical, i.e., may tend to twist to different extents in various directions. In other words, the warpage in a particular direction may tend to be worse than the warpage in the other direction. In this example, the fifth dummy holes 424 are arranged at positions designed to mitigate the warpage. To this end, more fifth dummy holes 424 may be arranged in a direction in which the warpage would otherwise be relatively severe in the semiconductor package, and fewer fifth dummy holes 424 may be arranged in a direction in which the warpage would otherwise tend to be less severe. The fifth dummy holes 424 may be arranged asymmetrically about the geometric center of the upper surface (footprint) of the mold layer 400.

The arrangement pattern of the fifth dummy holes 424 illustrated in FIG. 10 is merely an example, i.e., semiconductor packages based on the inventive concept of FIG. 10 are not limited to the arrangement of the fifth dummy holes shown in the figure.

Therefore, it is possible to effectively prevent warpage of the semiconductor package.

Figure 11:
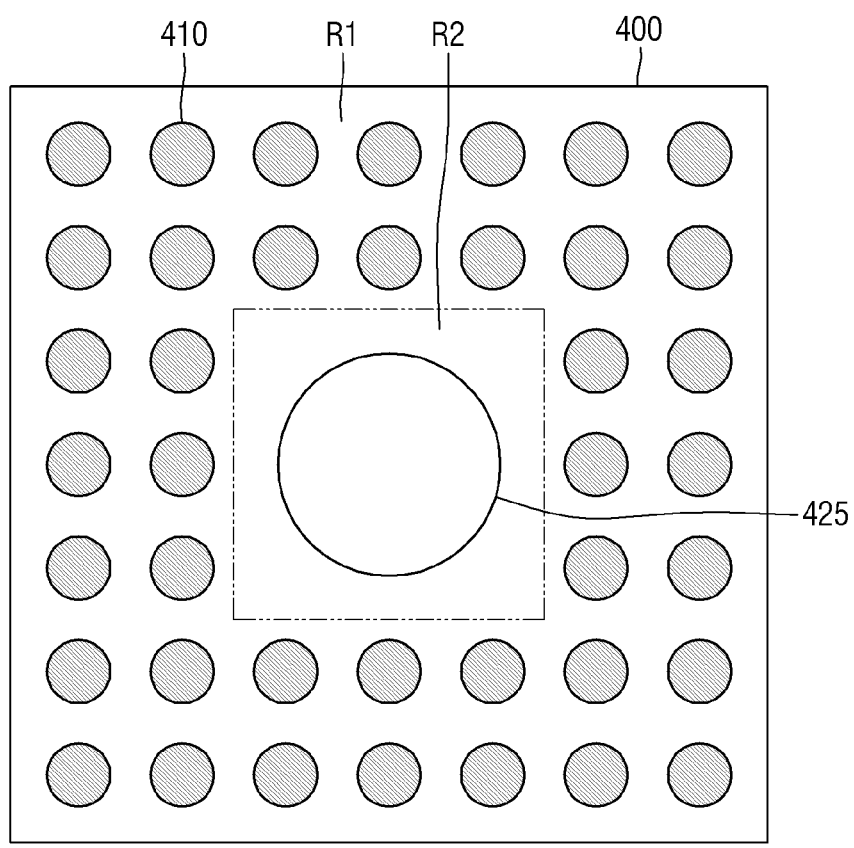
FIG. 11 is a plan view of another example of a semiconductor package according to the inventive concept.

Another version of a layout of a semiconductor package according to the inventive concept is shown in FIG. 11.

Referring to FIG. 11, the semiconductor package includes only one dummy hole 425. For purposes of this description only, the dummy hole will be referred to as a sixth dummy hole.

The sixth dummy hole 425 may be larger than each signal hole 410. The sixth dummy hole 425 may be located at the center of the second region R2. However, the inventive concept is not limited thereto. Rather, the relative shape and size of the sixth dummy hole 425 illustrated in FIG. 11 is merely an example.

In any case, because only one sixth dummy hole 425 is formed, the process of manufacturing a semiconductor package according to this example of the inventive concept may be relatively simple. Thus, the manufacturing cost can be low. Accordingly, the semiconductor package may be easily manufactured at a low cost and still effectively prevent warpage.

Figure 12:
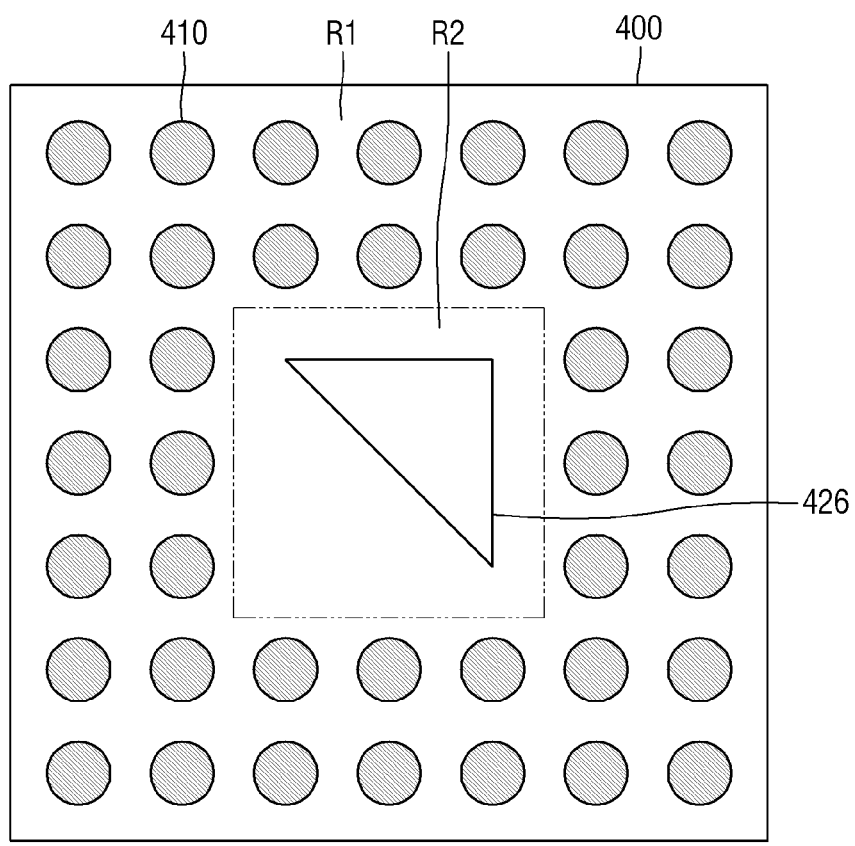
FIG. 12 is a plan view of another example of a semiconductor package according to the inventive concept.

Another version of a layout of the signal and dummy holes of a semiconductor package according to the inventive concept is shown in FIG. 12.

Referring to FIG. 12, the semiconductor package includes a single dummy hole 426 that is asymmetrical with respect to the geometric center of the upper surface (footprint) of the mold layer 400.

The seventh dummy hole 426 may have a size greater than that of the signal hole 410. The seventh dummy hole 426 may be arranged in a specific part of the second region R2.

Because only one seventh dummy hole 426 is formed, the process of manufacturing a semiconductor package according to this example of the inventive concept may be relatively simple. Also, as mentioned above, in some case, a semiconductor package may tend to warp into a shape that is not symmetrical, i.e., may tend to twist to different extents in various directions. In this example the seventh dummy hole 426 is formed to compensate for non-symmetrical warpage.

That is, the shape of the seventh dummy hole 426 may be more pronounced in a direction in which the warpage of the semiconductor package would otherwise tend to be relatively severe and less pronounced in a direction in which the warpage would otherwise tend to occur but be less severe. In this example, the seventh dummy hole 426 is illustrated as triangular and occupies about half the region R2. The shape, position, and size of the seventh dummy hole 426 illustrated in FIG. 12 is merely an example, though, and the inventive concept is not limited thereto.

In any case, a semiconductor package according to this example may be easily manufactured at a low cost and still effectively prevent warpage.

Figure 13:
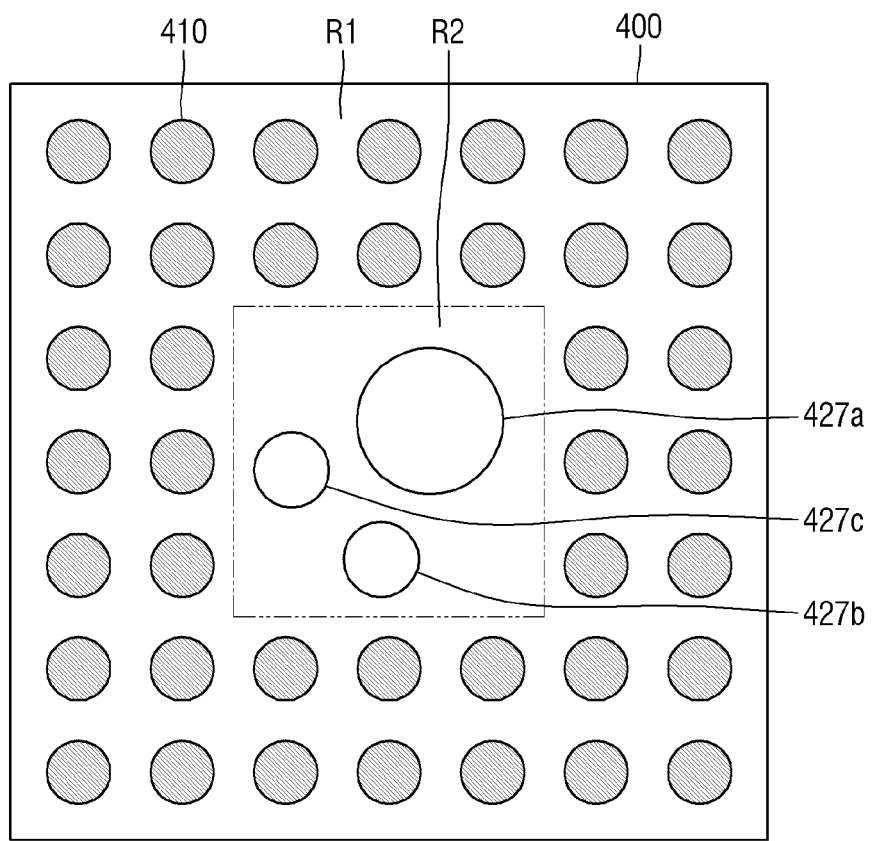
FIG. 13 is a plan view of still another example of a semiconductor package according to the inventive concept.

Another version of a layout of signal and dummy holes of a semiconductor package according to the inventive concept is shown in FIG. 13.

Referring to FIG. 13, the semiconductor package according to some embodiments of the present invention includes dummy holes of different sizes. For purposes of description only, the dummy holes will be referred to as eighth dummy holes.

In this example, a first one 427a of the eighth dummy holes may be the largest. Second 427b and third 427c ones of the eighth dummy holes may be smaller than that of the dummy hole 427a.

The eighth dummy holes 427a, 427b and 427c may have different sizes and the number of eighth dummy holes of equal size in one group may be different than the number of eighth dummy holes of another size. The eighth dummy holes 427a, 427b and 427c may also be asymmetrical with respect to the geometric center of the upper surface (footprint) of the mold layer 400.

However, the shapes, relative positions, number and sizes of the eighth dummy holes 427a, 427b and 427c illustrated in FIG. 13 are merely examples, i.e., the inventive concept is not limited thereto.

In the illustrated example, the larger first hole 427a is offset from the geometric center (footprint) of the upper surface of the mold layer 400 in the direction in which the warpage of the semiconductor package would otherwise be relatively severe, while the second hole 427b and/or the third hole 427c may be offset from the geometric center (footprint) of the upper surface of the mold layer 400 in the direction in which the warpage would otherwise occur but be less severe.

As a result, a semiconductor package according to this example can effectively prevent warpage.

Another example of a semiconductor package according to the inventive concept will be described referring to FIG. 14.

Figure 14:
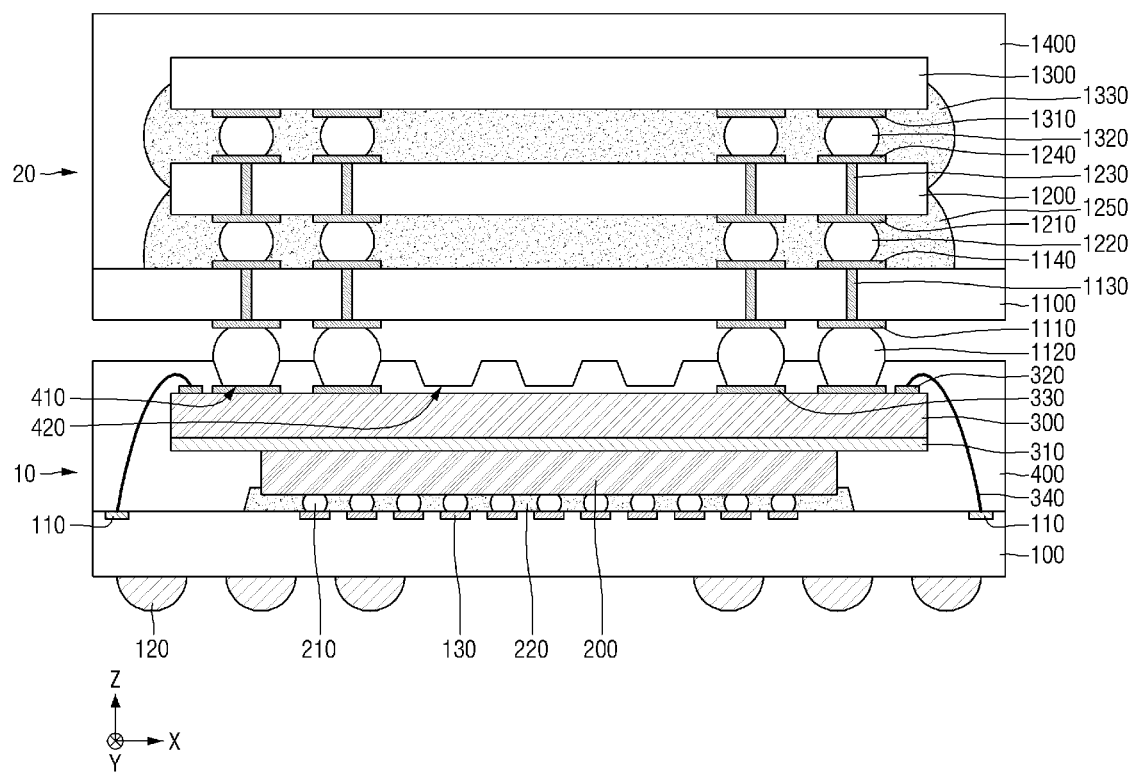
FIG. 14 is a cross-sectional view of another example of a semiconductor package according to the inventive concept.

The semiconductor package as illustrated in FIG. 14 includes an upper package 20 and a lower package 10.

The upper package 20 may be stacked on the lower package 10. Different types of chips may be provided in the upper package 20 and the lower package 10. For example, the lower package 10 may include a logic semiconductor chip, and the upper package 20 may include a memory chip. However, the inventive concept is not limited thereto.

The lower package 10 includes a package substrate 100, a flip chip 200, a micro bump 210, a first underfill film 220, an interposer 300, an adhesive film 310, a bonding wire 340, and a mold layer 400. The lower package 10 may be similar to any of the semiconductor packages described above with reference to FIGS. 1 to 13.

The upper package 20 may include an upper package substrate 1100, a second solder ball 1120, a first bump, a first memory chip 1200, a second underfill film 1250, a second bump, a second memory chip 1300, a third underfill film 1330, and an upper mold layer 1400.

The first memory chip 1200 and the second memory chip 1300 may be stacked on the upper package substrate 1100. The upper package substrate 1100 supports the first memory chip 1200 and the second memory chip 1300 and may be electrically connected to the first memory chip 1200 and the second memory chip 1300.

The upper package substrate 1100 may be, for example, a printed circuit board (PCB) or a ceramic substrate. However, the inventive concept is not limited thereto.

The lower package substrate terminal 1110 may be disposed at the lower surface of the upper package substrate 1100. The lower package substrate terminal 1110 is in contact with the second solder ball 1120 and may be electrically connected to the lower package 10.

The lower package substrate terminal 1110 may be formed of at least one material selected from the group consisting of copper, nickel, stainless steel and beryllium copper.

The second solder ball 1120 may be formed in the signal hole 410 of the lower package 10. The second solder ball 1120 may be in contact with the second terminal 330. The second solder ball 1120 may project above the level of the upper surface of the mold layer 400 through which the signal hole 410 extends.

The second solder ball 1120 may constitute a conductive path by which the lower package 10 and the upper package 20 are electrically connected to each other.

The upper package substrate 1100 may include a first TSV (Through Silicon Via) 1130 connected to the lower package substrate terminal 1110. The first TSV 1130 may extend through the upper package substrate 1100. The first TSV 1130 may transmit signals most rapidly.

The first TSV 1130 may be formed by double films of a core plug and a barrier metal. The core plug may include Cu or W. For example, the core plug may be made of, but is not limited to, Cu, CuSn, CuMg, CuNi, CuZn, CuPd, CuAu, CuRe, CuW, W or W alloy.

Furthermore, the core plug may include one or more of Al, Au, Be, Bi, Co, Cu, Hf, In, Mn, Mo, Ni, Pb, Pd, Pt, Rh, Re, Ru, Ta, Te, Ti, W, Zn and Zr, and may include one or two or more stacked structures.

The barrier metal may include at least one material selected from W, WN, WC, Ti, TiN, Ta, TaN, Ru, Co, Mn, WN, Ni, and NiB, and may be made up of a single layer or mult-layers.

The core plug and the barrier metal may be formed by a PVD (physical vapor deposition) process or a CVD (chemical vapor deposition) process, but the inventive concept is not limited thereto. A spacer insulating layer (not illustrated) may be interposed between the first TSV 1130 and the upper package substrate 1100. The spacer insulating layer may prevent direct contact between the semiconductor elements in the upper package substrate 1100 and the first TSV 1130.

The spacer insulating layer may be made up of an oxide film, a nitride film, a carbonized film, a polymer, or a combination thereof. In some embodiments, a CVD process may be used to form the spacer insulating layer. The spacer insulating layer may be formed of an O3/TEOS (ozone/tetra-ethyl-ortho-silicate)-based HARP (high aspect ratio process) oxide film formed by a lower-pressure CVD (sub-atmospheric CVD) process.

An upper package substrate terminal 1140 may be formed at the upper surface of the upper package substrate 1100. The upper package substrate terminal 1140 may be connected to the lower package substrate terminal 1110 by the first TSV 1130.

The first connection part 1220 may be formed on the upper package substrate terminal 1140. The first connection part 1220 may be an alloy of tin (Sn) and silver (Ag), and if necessary, copper (Cu), palladium (Pd), bismuth (Bi), antimony (Sb) or the like may be added. Furthermore, the first connection part 1220 may be a solder ball or a bump, and may further include a pillar layer made of a metal such as copper, nickel and gold, as required.

The first connection part 1220 may electrically connect the upper package substrate terminal 1140 and the first lower memory chip terminal 1210.

The first memory chip 1200 may be stacked on the first connection part 1220. The first memory chip 1200 may be electrically connected to the upper package substrate 1100 through the first connection part 1220. The first memory chip 1200 may be, for example, a memory semiconductor chip. The first memory chip 1200 may be a volatile memory semiconductor chip such as DRAM (Dynamic Random Access Memory) or SRAM (Static Random Access Memory), or may be a non-volatile memory semiconductor chip such as a PRAM (Phase-change Random Access Memory), an MRAM (Magnetoresistive Random Access Memory), a FeRAM (Ferroelectric Random Access Memory) or a RRAM (Resistive Random Access Memory). However, the inventive concept is not limited thereto.

The first memory chip 1200 may include a first lower memory chip terminal 1210, a second TSV 1230, and a first upper memory chip terminal 1240.

The first lower memory chip terminal 1210 may be formed at the lower surface of the first memory chip 1200. The first lower memory chip terminal 1210 may be in contact with the first connection part 1220. The first memory chip 1200 may be electrically connected to the upper package substrate 1100 via the first lower memory chip terminal 1210, the first connection part 1220 and the upper package substrate terminal 1140.

The second TSV 1230 may be formed through the first memory chip 1200. Because the second TSV 1230 extends in the third direction Z, it may most quickly transmit the signals.

The second TSV 1230 may be formed of the same material and structure as those of the first TSV 1130. That is, the second TSV 1230 may include a core plug and a barrier metal like the first TSV 1130. The second TSV 1230 may be formed by the same process as that used to form the first TSV 1130. Here, "the same" means the same method but executed at different time points.

The first upper memory chip terminal 1240 may be formed on the upper surface of the first memory chip 1200. The first upper memory chip terminal 1240 may be in contact with the second connection part 1320. The first memory chip 1200 may be electrically connected to the second memory chip 1300 through the first upper memory chip terminal 1240, the second connection unit 1320 and the second lower memory chip terminal 1310.

The second connection part 1320 may be formed at the first upper memory chip terminal 1240. Like the first connection part 1220, the second connection part 1320 may be an alloy of a tin (Sn) and silver (Ag), and as required, copper (Cu), palladium (Pd), bismuth (Bi), antimony (Sb) or the like may be added. Furthermore, the second connection part 1320 may be a solder ball or a bump, and may further include a pillar layer made of a metal such as copper, nickel and gold as required.

The second connection part 1320 may electrically connect the first upper memory chip terminal 1240 and the second lower memory chip terminal 1310.

The second memory chip 1300 may be stacked on the second connection part 1320. The second memory chip 1300 may be electrically connected to the first memory chip 1200 via the second connection part 1320.

The second memory chip 1300 may be a memory chip of the same kind as the first memory chip 1200. Or, the second memory chip 1300 may be a memory chip of a kind different from the first memory chip 1200.

The second memory chip 1300 may be, for example, a volatile memory semiconductor chip such as DRAM or SRAM, or a non-volatile memory semiconductor chip such as PRAM, MRAM, FeRAM or RRAM. However, the inventive concept is not limited thereto.

The second lower memory chip terminal 1310 may be formed at the lower surface of the second memory chip 1300. The second lower memory chip terminal 1310 may be in contact with the second connection part 1320. The second memory chip 1300 may be electrically connected to the first memory chip 1200 via the second lower memory chip terminal 1310, the second connection part 1320 and the first upper memory chip terminal 1240.

The second underfill film 1250 may fill the space between the upper package substrate 1100 and the first memory chip 1200. In this way, the second underfill film 1250 may be used to strengthen the coupling of the upper package substrate 1100 to the first memory chip 1200 or to prevent deformation. In addition, it is also possible to prevent entry of foreign matter or moisture.

The second underfill film 1250 may protrude from the space between the first memory chip 1200 and the upper package substrate 1100 to the outside of the side surface of the first memory chip 1200. Furthermore, the second underfill film 1250 may be integrally connected to a third underfill film 1330 to be described later. However, the inventive is not limited to these particulars.

Here, the expression "connected integrally" may mean that the second underfill film 1250 and the third underfill film 1330 are continuous without a boundary or an interface.

The third underfill film 1330 may fill the space between the first memory chip 1200 and the second memory chip 1300. The third underfill film 1330 may protrude from the space between the first memory chip 1200 and the second memory chip 1300 to the outside of the side surfaces of the first memory chip 1200 and the second memory chip 1300. Furthermore, the third underfill film 1330 may be integrally connected to the second underfill film 1250. However, the inventive concept is not limited thereto.

The upper mold layer 1400 may cover the upper package substrate 1100, the first memory chip, the second memory chip, the second underfill and the third underfill film 1330.

The upper mold layer 1400 may be formed of, for example, a silicon-based material, a thermosetting material, a thermoplastic material, a UV treatment material, or the like. Furthermore, the mold layer 400 may be formed of a polymer such as a resin, and may be formed of, for example, EMC.

FIG. 14 illustrates the upper package 20 as having two memory chips which are stacked, but the inventive concept is not limited thereto. That is, a semiconductor package according to inventive concept may include an upper package in which three or more memory chips are stacked. Alternatively, the upper package 20 may have only a memory chip without the upper package substrate 1400.

In semiconductor packages according to these examples, because the lower package 10 includes the dummy hole, it is possible to prevent the occurrence of warpage. Therefore, the reliability and durability of the lower package 10 are improved, and the operation performance of the semiconductor package can be improved.

Hereinafter, another example of semiconductor package according to the inventive concept will be described referring to FIG. 15.

Figure 15:
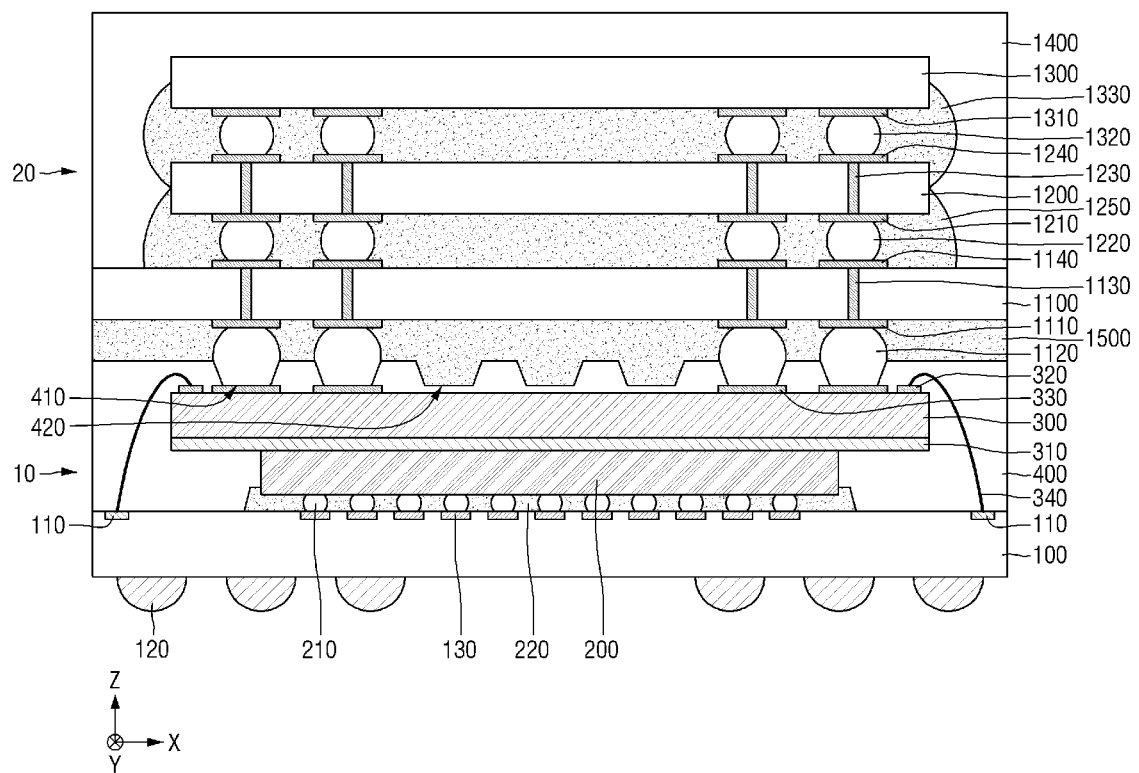
FIG. 15 is a cross-sectional view of another example of a semiconductor package according to the inventive concept.

The semiconductor package of the example of FIG. 15 includes a fourth underfill film 1500 between the upper package 20 and the lower package 10.

The fourth underfill film 1500 may surround the side surface of the second solder ball 1120. The second underfill film 1250 may fill the space between the upper package 20 and the lower package 10. The fourth underfill film 1500 may include an underfill resin such as an epoxy resin, a silica filler or a flux.

In the semiconductor package according to this example, because the coupling between the upper package 20 and the lower package 10 is rigid, and the warpage of the lower package 10 is resisted by the upper package 20 coupled thereto by the fourth underfill film 1500, it is possible to provide the semiconductor package with high reliability and durability.

Hereinafter, another example of a semiconductor package according to the inventive concept will be described referring to FIG. 16.

Figure 16:
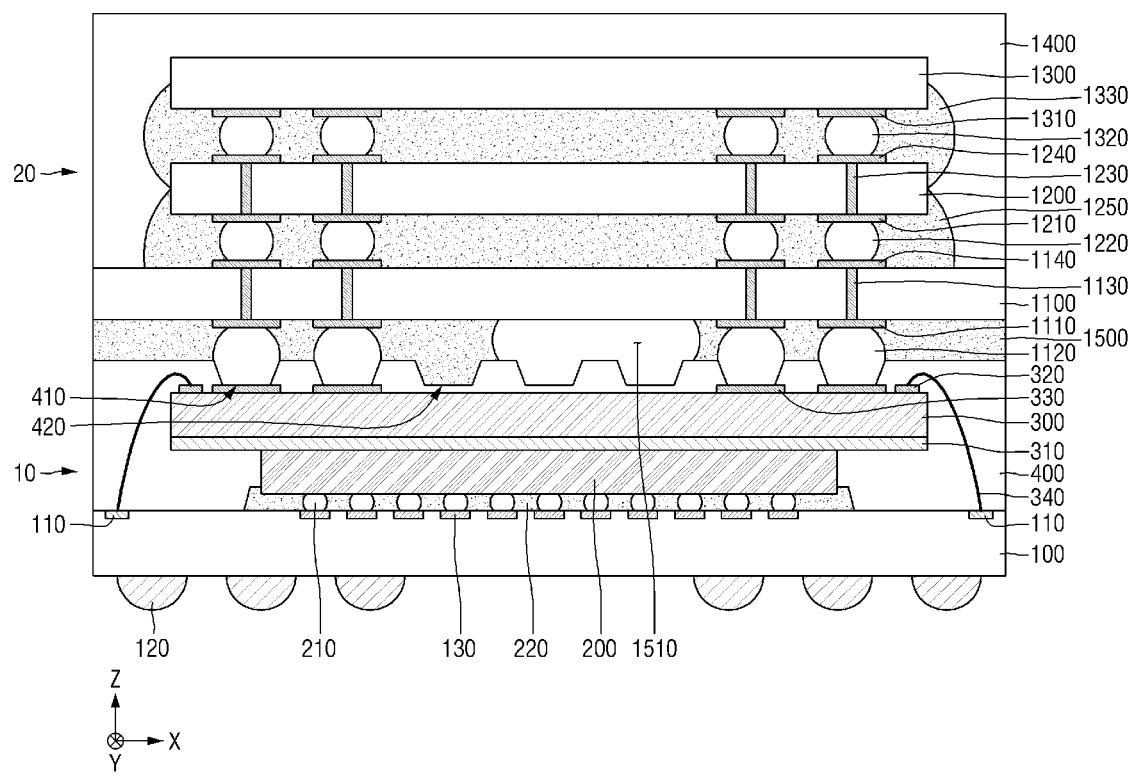
FIG. 16 is a cross-sectional view of still another example of a semiconductor package according to the inventive concept.

The semiconductor package according to the example of FIG. 16 includes an air gap 1510.

The air gap 1510 may be located inside the fourth underfill film 1500. The air gap 1510 may be formed between the upper package 20 and the lower package 10.

In the semiconductor package according to this example, the air gap 1510 mitigates the warpage otherwise induced in the package by the thermal expansion of the fourth underfill film 1500. Therefore, the semiconductor package has an enhanced durability.

Finally, although the present inventive concept has been particularly shown and described with reference to various examples thereof, it will be understood by those of ordinary skill in the art that various changes in form and details may be made therein without departing from the spirit and scope of the present inventive concept as defined by the following claims. It is therefore to be understood that the above-described examples are illustrative and not restrictive, reference being made to the appended claims rather than the foregoing description to indicate the true spirit and scope of the invention.

What is claimed is:

1. A semiconductor package comprising:
a package substrate;
a flip chip coupled to the package substrate;
an interposer stacked on the flip chip and including an interposer substrate, and a first terminal and a second terminal on an upper surface of the interposer substrate;
a bonding wire which connects the first terminal and the package substrate;
a mold layer which covers the interposer, the flip chip and the bonding wire,
wherein the mold layer has a signal hole therein which leads to and opens at the second terminal, and at least one dummy hole therein spaced apart from the signal hole and situated over the upper surface of the interposer,
wherein part of the mold layer extends over the upper surface of the interposer, and
each said at least one dummy hole extends completely through said part of the mold layer; and
a protective film on the upper surface of the interposer and exposed by each said at least one dummy hole.

2. The semiconductor package of claim 1, wherein the first and second terminals are disposed on a first region of the upper surface of the interposer, and
the protective film is disposed on a second region of the upper surface of the interposer that is apart from the first region.

3. The semiconductor package of claim 1, wherein respective shapes of the signal hole and each said at least one dummy hole are the same.

4. The semiconductor package of claim 1, wherein the at least one dummy hole comprises a plurality of dummy holes each situated over the upper surface of the interposer, and
respective sizes of the signal hole and each of the dummy holes, as viewed in a plan view, are the same.

5. The semiconductor package of claim 1, wherein respective depths of the signal hole and each said at least one dummy hole are the same.

6. The semiconductor package of claim 1, wherein the signal hole is situated over a first region of the upper surface of the interposer,
the at least one dummy hole is situated over a second region of the upper surface of the interposer, and
the first region is located further towards an outer periphery of the upper surface of the interposer than the second region.

7. The semiconductor package of claim 1, further comprising:
a micro bump which electrically connects the package substrate and the flip chip.

8. A semiconductor package comprising:
a lower package; and
an upper package stacked on the lower package,
wherein the lower package comprises
a package substrate,
a flip chip coupled to the package substrate,
an interposer stacked on the flip chip and including an interposer substrate, and a first terminal and a second terminal on an upper surface of the interposer substrate, and
a mold layer which covers the interposer and the flip chip,
the mold layer having a signal hole therein which leads to and is open at the second terminal, and at least one dummy hole therein spaced apart from the signal hole and situated over the upper surface of the interposer, and
wherein the at least one dummy hole is empty or filled with a non-electrically conducting medium.

9. The semiconductor package of claim 8, wherein the lower package further includes a solder ball situated in the signal hole as disposed in contact with the second terminal, wherein the upper package is in contact with the solder ball.

10. The semiconductor package of claim 8, wherein the upper package includes a first memory chip and a second memory chip stacked on the first memory chip.

11. The semiconductor package of claim 8, wherein the lower package further includes a bonding wire which connects the package substrate and the first terminal.

12. The semiconductor package of claim 8, wherein the at least one dummy hole comprises a plurality of dummy holes, and
an arrangement of the dummy holes is non-uniform.

13. The semiconductor package of claim 8, wherein an air gap exists between the upper package and the lower package.

14. A semiconductor package comprising:
a package substrate;
a plurality of microbumps disposed on the package substrate;
a flip chip stacked on the plurality of microbumps and electrically connected to the package substrate via the plurality of microbumps;
an underfill film which surrounds the plurality of microbumps between the flip chip and the package substrate;
an adhesive film on the flip chip;
an interposer which is stacked on the adhesive film and includes an interposer substrate and a first terminal and a second terminal on an upper surface of the interposer substrate;
a bonding wire which electrically connects the first terminal and the package substrate;
a mold layer which covers the interposer, the flip chip and the bonding wire,
wherein the mold layer has a signal hole therein which leads to and is open at the second terminal, and at least one dummy hole therein spaced apart from the signal hole and situated over the upper surface of the interposer; and
a protective film on the upper surface of the interposer and exposed by each of the at least one dummy hole.

15. The semiconductor package of claim 14, wherein a dimension of the interposer in a horizontal direction parallel to the upper surface thereof is greater than a dimension of the flip chip in said horizontal direction.

16. The semiconductor package of claim 14, further comprising:
a solder ball disposed inside the signal hole.

17. The semiconductor package of claim 16, further comprising:
a memory package stacked on the solder ball.

18. The semiconductor package of claim 14, wherein the at least one dummy hole comprises a plurality of dummy holes situated over the upper surface of the interposer.

19. The semiconductor package of claim 14, wherein a thickness of the protective film and a thickness of the second terminal are the same.

20. The semiconductor package of claim 14, wherein the first and second terminals are disposed on a first region of the upper surface of the interposer, and
the protective film is disposed on a second region of the upper surface of the interposer that is apart from the first region and is not disposed on the first region.

* * * * *